(12) United States Patent
Chun

(10) Patent No.: US 7,674,677 B2
(45) Date of Patent: Mar. 9, 2010

(54) SEMICONDUCTOR DEVICE AND A METHOD FOR MANUFACTURING THE SAME

(75) Inventor: Sung Kil Chun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 205 days.

(21) Appl. No.: 11/773,802

(22) Filed: Jul. 5, 2007

(65) Prior Publication Data

US 2008/0290404 A1 Nov. 27, 2008

(30) Foreign Application Priority Data

May 22, 2007 (KR) .................. 10-2007-0049654

(51) Int. Cl.
*H01L 21/336* (2006.01)
(52) U.S. Cl. .............. 438/259; 438/270; 257/E21.655
(58) Field of Classification Search .......... 438/259, 438/270, 271, 272, 588; 257/E21.655
See application file for complete search history.

(56) References Cited

U.S. PATENT DOCUMENTS 7,378,312 B2 * 5/2008 Kim ..................... 438/243
2007/0082442 A1 4/2007 Kim

FOREIGN PATENT DOCUMENTS

| KR | 1020000019080 A | 4/2000 |
| KR | 1020040064924 A | 7/2004 |
| KR | 1020050038425 A | 4/2005 |
| KR | 1020060075426 A | 7/2006 |

* cited by examiner

*Primary Examiner*—Hoai v Pham
(74) *Attorney, Agent, or Firm*—Townsend and Townsend and Crew LLP

(57) ABSTRACT

A semiconductor device includes a semiconductor substrate provided with an active region including a gate forming area, a source forming area and a drain forming area. A recess is formed in the gate forming area. A gate is formed over the gate forming area that is formed with the recess and includes an insulation layer formed at an upper end portion of a side wall of the recess that is in contact with the source forming area. A source area and a drain area are formed in the active region on opposite sides of the gate.

20 Claims, 6 Drawing Sheets

SEMICONDUCTOR DEVICE AND A METHOD FOR MANUFACTURING THE SAME

CROSS-REFERENCE TO RELATED APPLICATIONS

The present application claims priority to Korean patent application number 10-2007-0049654 filed on May 22, 2007, which is incorporated herein by reference in its entirety.

BACKGROUND OF THE INVENTION

The present invention relates to a semiconductor device, and more particularly, to a semiconductor device capable of reducing the effect of gate induced drain leakage (GIDL), and a method for manufacturing the same.

As high integration of a semiconductor device has continued to proceed, a channel length of a transistor has been shortened and an ion implantation concentration of source and drain areas has been increased. As a result of these changes, a short channel effect has became a serious problem in which a threshold voltage (Vt) is lowered as charge sharing between the source area and the drain area is increased. In addition, controllability of a gate is reduced. Also, a refresh property deteriorates due to an increase in junction leakage current that results from an increase in an electric field in the source area and the drain area. Therefore, conventional semiconductor devices with a planar channel offer limited capability for overcoming problems that result from high integration.

For this reason, research has been actively performed to fabricate a semiconductor device with a recess channel, which is capable of improving an effective channel length.

Hereinafter, a method for manufacturing a semiconductor device having a conventional recess channel will be briefly described.

After an isolation layer is formed in an isolation region of a semiconductor substrate having an active region including a gate forming area and the isolation region, a screen oxide layer is formed over an entire surface of the semiconductor substrate that is formed with the isolation layer. Ion implantation is performed to adjust a threshold voltage. An ion implantation of the source/drain is sequentially performed on the semiconductor substrate formed with the screen oxide layer. The screen oxide layer is then removed.

After a mask pattern that is used for exposing the gate forming area of the active region is formed over the ion implanted semiconductor substrate, the portion of the semiconductor substrate exposed by the mask pattern is etched to form a recess in the gate forming area of the active region. The mask pattern is then removed.

After a gate insulation layer is formed over the semiconductor substrate including the recess, a gate conductive layer is formed over the gate insulation layer to fill in the recess. The gate insulation layer is formed as an oxide layer and the gate conductive layer is formed as a laminated layer of a polysilicon layer and a tungsten layer. A hard mask layer made of a nitride layer is then formed over the gate conductive layer.

By patterning the hard mask layer, the gate conductive layer, and the gate insulation layer, a transistor having a recess channel is formed in the gate forming area that includes the recess.

A series of known follow up processes are sequentially performed, thereby completing formation of a semiconductor device having the recess channel.

Meanwhile, as aforementioned, as a cell size has been scaled down with high integration of the semiconductor device, a channel doping concentration has been excessively increased to maintain the threshold voltage at the same level. As a result, the refresh property deteriorates.

For this reason, in order to prevent deterioration of the refresh property, a method has been proposed to adjust the threshold voltage (Vt) by applying a P+ polysilicon layer instead of an N+ polysilicon layer.

When applying the P+ polysilicon layer instead of the N+ polysilicon layer, it is possible to significantly decrease the channel doping concentration. The threshold voltage can be ensured even with a low channel dose through a difference in band gap voltage of the semiconductor substrate made of silicon. Also, the refresh property can be improved.

However, in the case of applying the P+ polysilicon layer to the recess channel structure, a band gap is seriously bent due to a Fermi level difference, e.g., approximately 1.1V, between the source/drain area and the gate. As a result, a GIDL phenomenon results at an upper end portion of a side wall of the recess adjacent to the source area, which in turn increases the leakage current and deteriorates the refresh property.

In a GIDL phenomenon, current leaks in the form of an electric field and is concentrated into both edge portions where the gate and the semiconductor substrate contact each other. GIDL is a problem which should be addressed to improve device properties and reliability. Also, GIDL is a major factor in reducing a refresh time of the device.

BRIEF SUMMARY OF THE INVENTION

Embodiments of the present invention are directed to a semiconductor device, which is capable of reducing the effect of a GIDL phenomenon when applying a P+ polysilicon layer to the recess channel structure thereby improving device properties and reliability, and a method for manufacturing the same.

In one embodiment, a semiconductor device may include a semiconductor substrate provided with an active region including a gate forming area, a source forming area and a drain forming area. The gate forming area is formed with a recess. A gate formed over the gate forming area is formed with the recess and includes an insulation layer formed at an upper end portion of a side wall of the recess that is in contact with the source forming area. A source area and a drain area are formed in the active region on opposite sides of the gate.

The semiconductor device may further include a P+ polysilicon layer filled in the recess as a gate conductive layer.

The recess has a depth that is deeper than a lower surface of the source area and the drain area.

The insulation layer has a width of approximately ⅕ to ½ of a critical dimension of the gate.

The insulation layer has a thickness of approximately 100 to 200 Å from a surface of the semiconductor substrate.

The insulation layer is formed so that its lower surface is positioned substantially similar to a lower surface of the source area.

The insulation layer is formed as an oxide layer.

In another embodiment, a method for manufacturing a semiconductor device may comprise performing source/drain ion implantation on a semiconductor substrate having an active region including a gate forming area to form a source area and a drain area. A recess is formed in the gate forming area of the semiconductor substrate. A gate insulation layer is formed over the semiconductor substrate including the recess. A first gate conductive layer is formed over the gate insulation layer to fill in the recess. The first gate conductive layer is etched to remove a portion of the first gate conductive layer formed at an upper end portion of the side wall of the recess that is in contact with the source area. An insulation layer is formed at the upper end portion of the side wall of the recess from which the first gate conductive layer is removed. A second gate conductive layer is formed over the insulation layer and the first gate conductive layer. A third gate conductive layer and a hard mask layer are formed over the second gate conductive layer. The hard mask layer, the third gate conductive layer, the second gate conductive layer, the first gate conductive layer, the insulation layer, and the gate insulation layer are etched to form a gate.

The method for manufacturing a semiconductor device may further include forming a screen oxide layer over the semiconductor substrate. Before the formation of the source area and the drain area, a semiconductor substrate is formed with the screen oxide layer to form a threshold voltage adjusting ion implantation layer that is positioned below the source/drain area and implanted with ions to adjust the threshold voltage.

The recess is formed to a depth deeper than a lower surface of the source area and the drain area.

The first gate conductive layer is formed as a P+ polysilicon layer.

The etching of the first gate conductive layer includes forming a mask pattern for exposing a portion of the first gate conductive layer formed at a portion of the recess that is in contact with the source area over the first gate conductive layer. The portion of the first gate conductive layer exposed by the mask pattern is etched. The mask pattern is then removed.

The insulation layer is formed to have a thickness of approximately 100 to 200 Å from a surface of the semiconductor substrate.

The insulation layer has a width of approximately ⅕ to ½ of a critical dimension of the gate.

The insulation layer is formed so that its lower surface is positioned substantially similar to a lower surface of the source area.

The insulation layer is formed as an oxide layer.

The method for manufacturing a semiconductor device may further include planarizing a surface of the second gate conductive layer, after the formation of the second gate conductive layer and before the formation of the third gate conductive layer.

In yet another embodiment, a method for manufacturing a gate of a semiconductor device may include forming a recess in a gate forming area of a semiconductor substrate having an active region that includes the gate forming area. A gate insulation layer is formed over the semiconductor substrate including the recess. A first gate conductive layer is formed over the gate insulation layer to fill in the recess. The first gate conductive layer is etched to remove a portion of the first gate conductive layer that corresponds to an upper end portion of a side of the recess. An insulation layer is formed at the upper end portion of the side of the recess from which the portion of the first gate conductive layer is removed. A second gate conductive layer is formed over the insulation layer and the first gate conductive layer. A third gate conductive layer and a hard mask layer are formed sequentially over the second gate conductive layer. The hard mask layer, the third gate conductive layer, the second gate conductive layer, the first gate conductive layer, the insulation layer and the gate insulation layer are then etched.

The recess is formed to a depth deeper than a lower surface of the source area and the drain area.

The first gate conductive layer is formed as a P+ polysilicon layer.

The insulation layer is formed to have a thickness of approximately 100 to 200 Å from a surface of the semiconductor substrate.

The insulation layer has a width of approximately ⅕ to ½ of a critical dimension of the gate.

The insulation layer is formed as an oxide layer.

The insulation layer is formed so that its lower surface is positioned substantially similar to a lower surface of the source area.

DESCRIPTION OF SPECIFIC EMBODIMENTS

A preferred embodiment of the present invention is directed to a semiconductor device in which an insulation layer is formed to a thickness that is selectively thicker at an upper end portion of a side wall of a recess. The upper end portion of the side wall is in contact with a source area when applying P+ polysilicon layer to a recess channel structure.

An electric field in edge portions where a gate and a semiconductor substrate contact each other, i.e. between the source area and P+ polysilicon gate, is decreased to reduce the effect of a GIDL phenomenon. Due to this decrease in the electric field, a cell property and a refresh property of a device can be improved.

Figure 1:
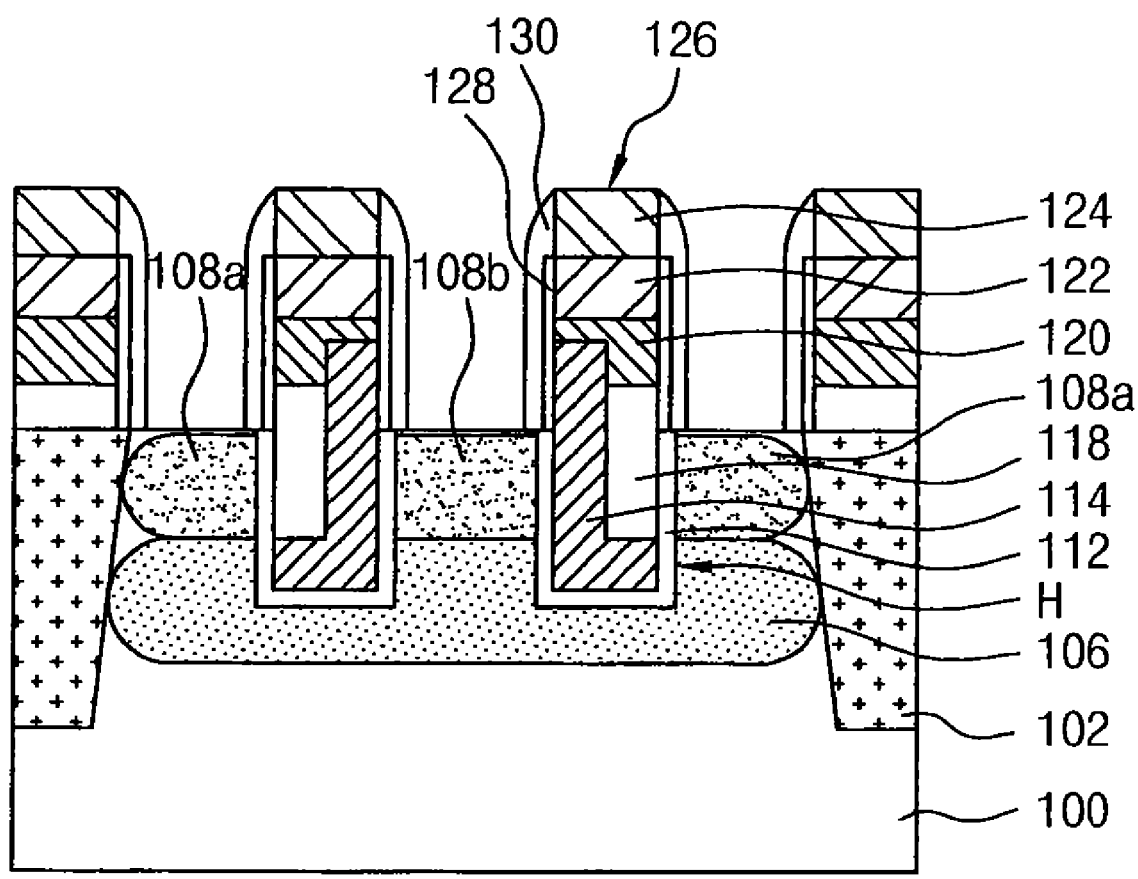
FIG. 1 is a cross-sectional view illustrating a semiconductor device in accordance with an embodiment of the present invention.

FIG. 1 is a cross-sectional view illustrating a semiconductor device in accordance with an embodiment of the present invention.

A gate forming area of a semiconductor substrate 100 is formed within an active region that includes the gate forming area, a source forming area, a drain forming area, and a recess H that has a depth deeper than the source and drain forming areas. A gate 126 is formed in the gate forming area, which includes the recess H and, also, a source area 108a and a drain area 108b that are formed in the active region on opposite sides of the gate 126. The gate 126 includes a gate insulation layer 112 that is formed over a surface of the recess H. An insulation layer 118 is formed at an upper end portion of the recess H that is in contact with the source area 108a. A gate conductive layer 114, 120, 122 is formed over the gate insulation layer 112. A hard mask layer 124 is formed over the gate conductive layer 114, 120, and 122.

The gate insulation layer 112 and the insulation layer 118 are formed as an oxide layer. The gate conductive layer 114, 120, 122 is formed as a laminated layer of P+ polysilicon layers 114, 120 and a metal based layer 122. The hard mask layer 124 is formed as a nitride layer. The insulation layer 118 has a lower surface that is positioned substantially similar to a lower surface of the source area.

The insulation layer 118 has a width of approximately ⅕ to ½ of a critical dimension (CD) of the gate 126 and is formed to have a thickness more than approximately 100 Å, and preferably 100 to 200 Å, from a surface of the semiconductor substrate.

In FIG. 1, reference symbols 102, 106, 128, and 130, which are not described, denote an isolation layer, a threshold voltage adjusting ion implantation layer, a light oxide layer, and a spacer, respectively.

In the semiconductor device in accordance with the present invention, the insulation layer 118 is selectively formed at the side wall of the recess H that is in contact with the source area 108a. As a result, a magnitude of an electric field in both edges of the recess H is decreased thereby reducing the effect of the GIDL phenomenon. Accordingly, this improvement can prevent the deterioration of the refresh property caused by the GIDL phenomenon, which results in better device properties and reliability.

Hereinafter, a method for manufacturing the semiconductor device in accordance with an embodiment of the present invention will be described with reference to FIGS. 2A through 2I.

Figure 2A:
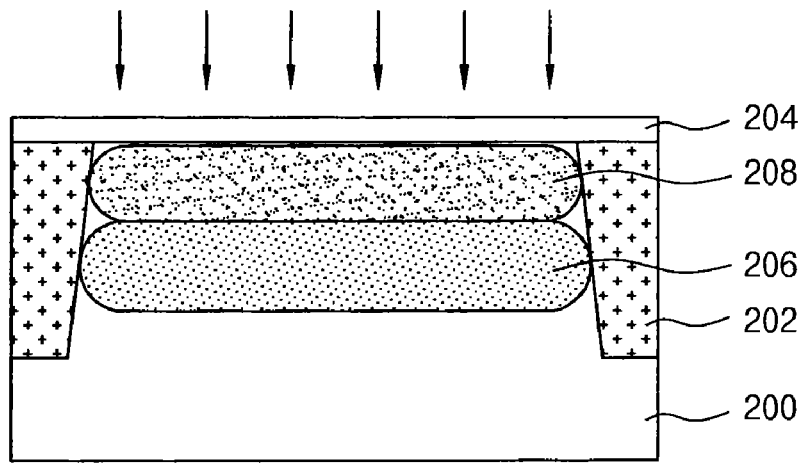
FIGS. 2A through 2I are cross-sectional views illustrating the process steps of a method for manufacturing the semiconductor device in accordance with an embodiment of the present invention.

Referring to FIG. 2A, an isolation layer 202 defining an active region is formed in an isolation region of a semiconductor substrate 200 having the active region that includes a gate forming area and the isolation region. A screen oxide layer 204 is formed over an entire surface of the semiconductor substrate 200 including the isolation layer 202. A threshold voltage adjusting ion implantation process (not shown) is conducted to form the threshold voltage adjusting ion implantation layer 206 in the semiconductor substrate 200, which is coated with the screen oxide layer 204. A source/drain ion implantation process is performed on the semiconductor substrate 200 with the threshold voltage adjusting ion implantation layer 206 to form a junction area 208 at an upper portion of the threshold voltage adjusting ion implantation layer 206 in the semiconductor substrate 200. N-type impurities are used in the source/drain ion implantation process to form the junction area 208, which is an N-type ion implantation layer.

Figure 2B:
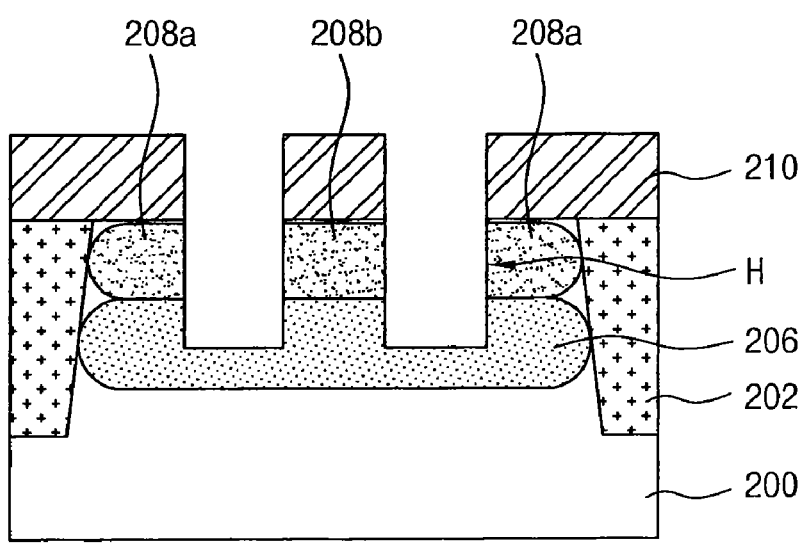

Referring to FIG. 2B, the screen oxide layer is removed. A recess mask 210 for exposing the gate forming area is formed over the semiconductor substrate 200. A portion of the semiconductor substrate 200 exposed by the recess mask 210 is etched to form a recess H in the gate forming area. The junction area is separated by the recess H to form a source area 208a and a drain area 208b. The recess H is formed by a dry etch process to have a depth deeper than a lower surface of the source area 208a and the drain area 208b.

Figure 2C:
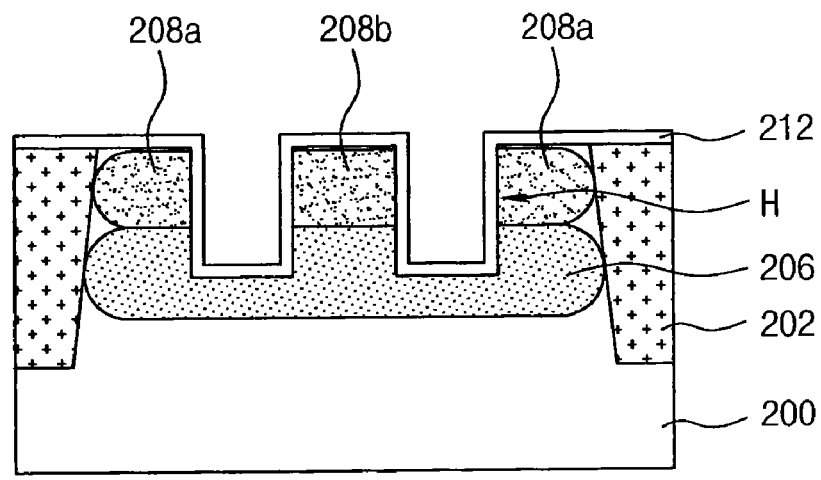

Referring to FIG. 2C, the recess mask is removed through a known process. A gate insulation layer 212 is formed over the semiconductor substrate 200 and the recess H. The gate insulation layer 212 is formed as an oxide layer through a thermal oxidation process.

Figure 2D:
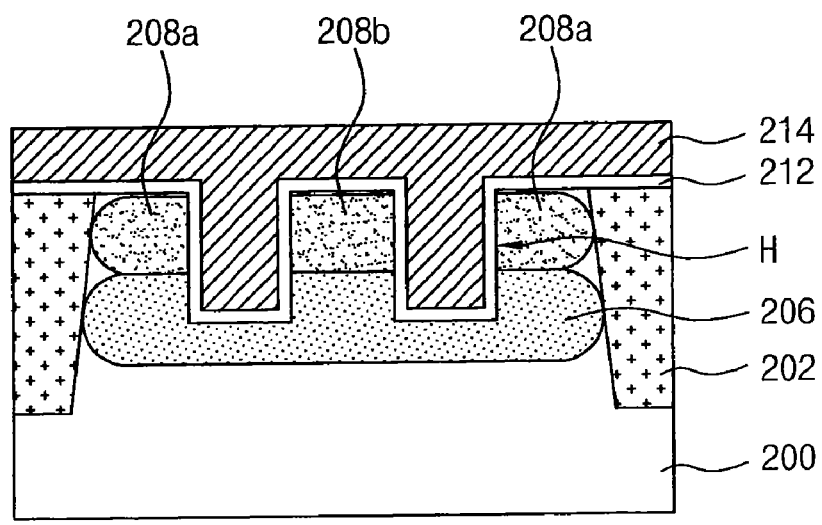

Referring to FIG. 2D, a first gate conductive layer 214 is formed over the gate insulation layer 212 to fill in the recess H. The first gate conductive layer 214 is formed as a P+ polysilicon layer and a surface of the layer is planarized after a deposition.

Figure 2E:
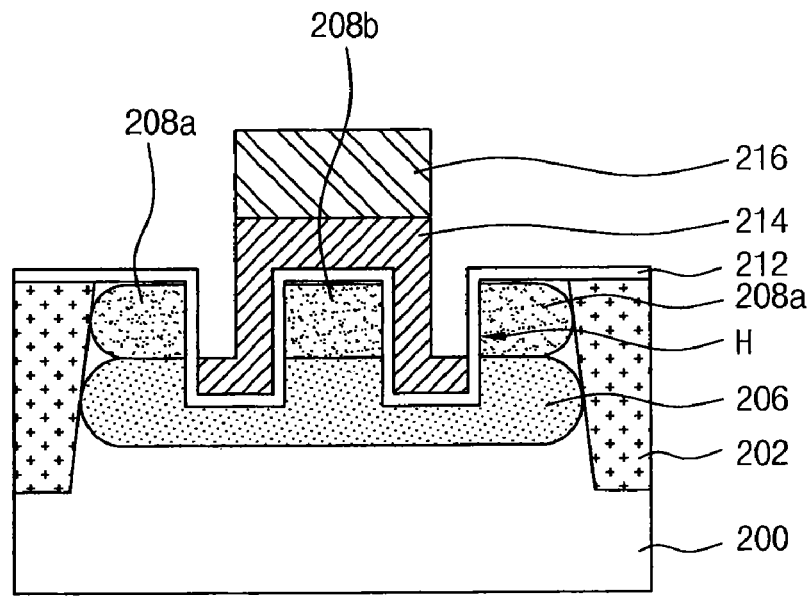

Referring to FIG. 2E, a mask pattern 216 is formed over the first gate conductive layer 214 to expose a portion of the first gate conductive layer 214 that is formed over a portion of recess H having an upper end portion of a sidewall that is in contact with the source area 208a. The portion of the first gate conductive layer 214 exposed by the mask pattern 216 is etched by some thickness. The etching is performed in a dry etch manner. In addition, the etching is performed so that the portion of the first gate conductive layer 214 is etched to a depth substantially similar to a depth of a lower surface of the source area 208a and the drain area 208b. As a result of the etching, the portion of the first gate conductive layer 214 is removed at the upper end portion of the side wall of the recess H that is in contact with the source area 208a.

Figure 2F:
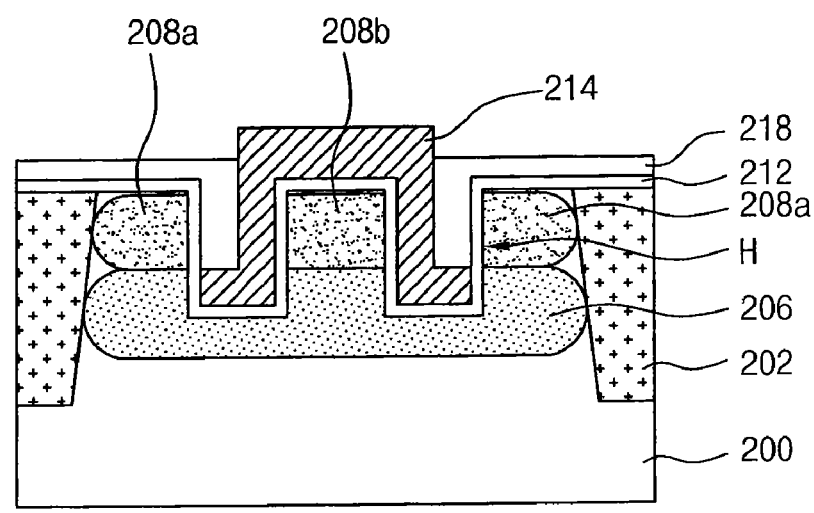

Referring to FIG. 2F, the mask pattern is removed. The upper portion of the side wall of the recess H, in which the first gate conductive layer 214 is removed, is filled in with an insulation layer 218 that is positioned substantially similar to a lower surface of the source area 208a. The insulation layer 218 is formed as an oxide layer and is formed to have a width of approximately less than half, and preferably ⅕ to ½, of a gate CD. In addition, the insulation layer 218 is formed to have a thickness of more than approximately 100 Å, and preferably 100 to 200 Å, from the surface of the semiconductor substrate 200 in order to protect the semiconductor substrate 200.

Hereinafter, in the present invention, the insulation layer 218 is selectively formed at the upper end portion of a side wall of the recess H that is in contact with the source area 208a. The insulation layer 218 is formed to be thicker at the upper end portion of the side wall of the recess H than at the other portions. Thus, the effect of GIDL phenomenon can be effectively reduced because the GIDL phenomenon is inversely proportional to a thickness of the insulation layer.

Figure 2G:
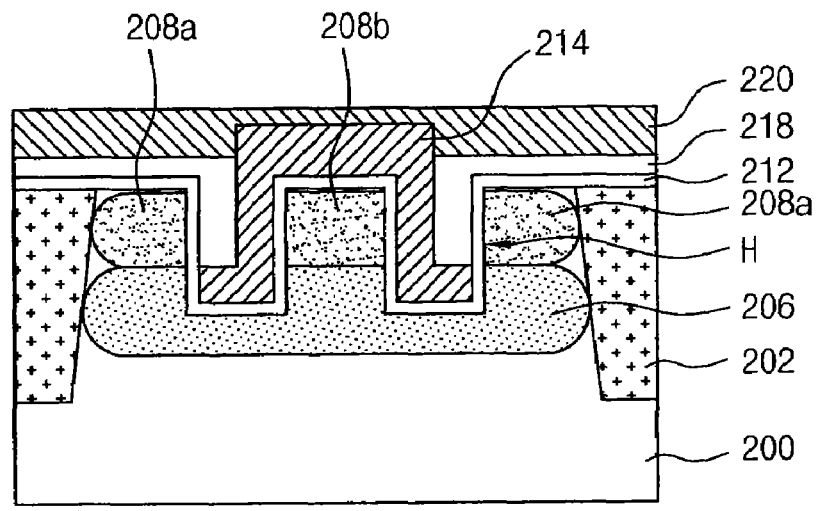

Referring to FIG. 2G, a second gate conductive layer 220 is formed over the insulation layer 218 and the first gate conductive layer 214. The second gate conductive layer 220 is formed as a P+ polysilicon layer. A surface of the layer is also planarized after the deposition.

Figure 2H:
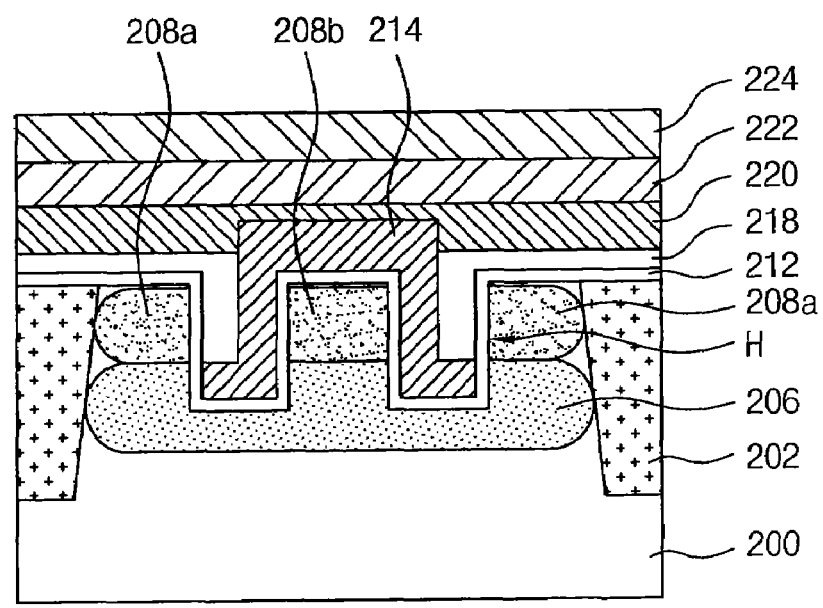

Referring to FIG. 2H, a third gate conductive layer 222 and a hard mask layer 224 are sequentially formed over the second gate conductive layer 220. The third gate conductive layer 222 is formed as a metal based layer; for example, a tungsten layer. The hard mask layer 224 is formed as a nitride layer.

Figure 2I:
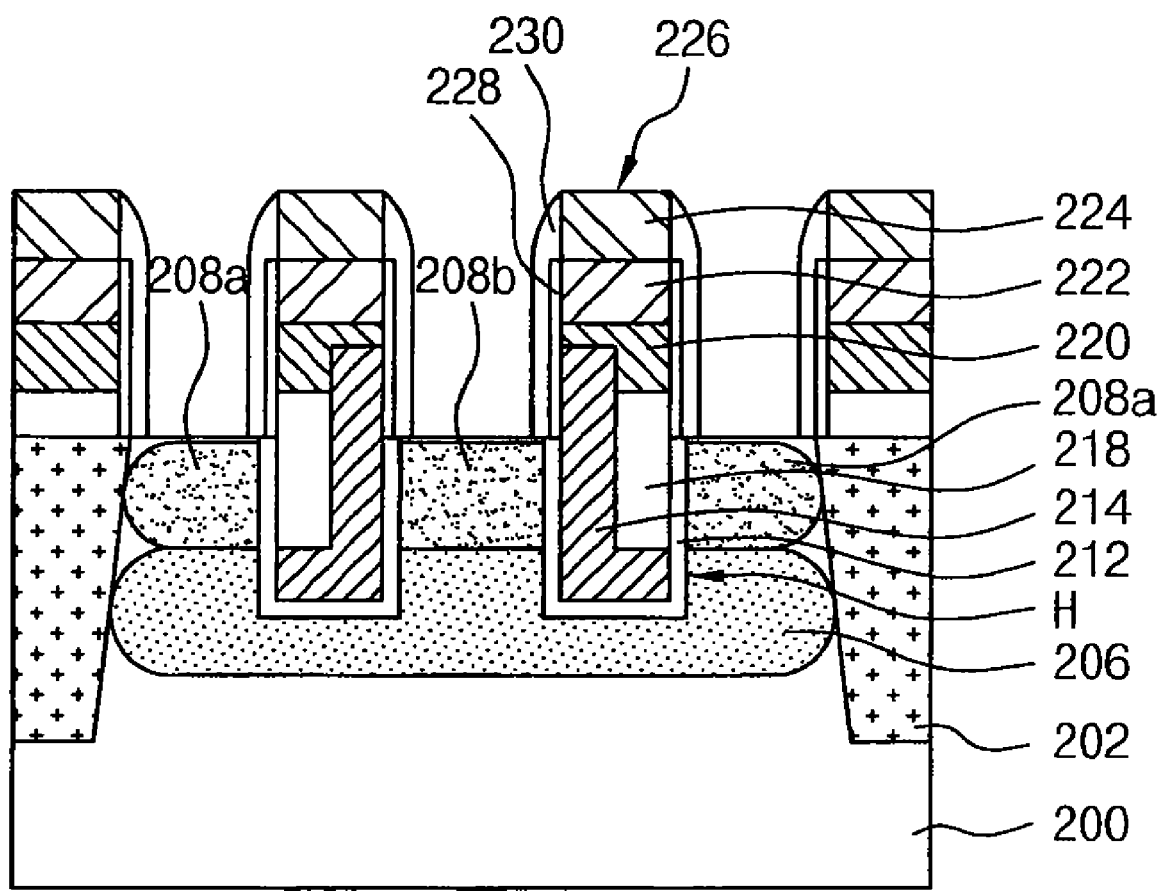

Referring to FIG. 2I, the hard mask layer 224, the third gate conductive layer 222, the second gate conductive layer 220, the first gate conductive layer 214, the insulation layer 218, and the gate insulation layer 212 are patterned in a dry etch manner to form a gate 226 with a P+ polysilicon layer in the gate forming area including the recess H. A light oxide layer 228 is formed along each side wall of the gate 226 between the upper surface of the source/drain areas and the hard mask layer 224. A spacer 230 is formed along each side wall of the gate 226 including the light oxide layer 228 and the hard mask layer 224.

Though not shown, a series of known follow up processes is sequentially performed to complete the semiconductor device in accordance with the present invention.

As is apparent from the above description, in an embodiment of the present invention, a thicker insulation layer is selectively formed at the upper end portion of the side wall of the recess that is in contact with the source area when applying P+ polysilicon layer to a recess channel structure. As a result, the effect of the GIDL phenomenon that occurs at the upper end portion of the side wall of the recess can be reduced. Therefore, by reducing the effect of the GIDL phenomenon, the refresh property can be improved; thus, device properties and reliability can be enhanced.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, the method comprising:
   performing source/drain ion implantation on a semiconductor substrate having an active region including a gate forming area to form a source area and a drain area;
   forming a recess in the gate forming area of the semiconductor substrate;
   forming a gate insulation layer over the semiconductor substrate including the recess;

forming a first gate conductive layer over the gate insulation layer to fill in the recess;

etching the first gate conductive layer to remove a portion of the first gate conductive layer formed at an upper end portion of the side wall of the recess that is in contact with the source area;

forming an insulation layer at the upper end portion of the side wall of the recess from which the first gate conductive layer is removed;

forming a second gate conductive layer over the insulation layer and the first gate conductive layer;

forming a third gate conductive layer and a hard mask layer over the second gate conductive layer; and etching the hard mask layer, the third gate conductive layer, the second gate conductive layer, the first gate conductive layer, the insulation layer, and the gate insulation layer to form a gate.

2. The method for manufacturing a semiconductor device according to claim 1, further comprising, before forming the source area and the drain area:

forming a screen oxide layer over the semiconductor substrate; and performing a threshold voltage adjusting ion implantation on the semiconductor substrate formed with the screen oxide layer to form a threshold voltage adjusting ion implantation layer under the source area and the drain area.

3. The method for manufacturing a semiconductor device according to claim 1, wherein the recess is formed to a depth deeper than a lower surface of the source area and the drain area.

4. The method for manufacturing a semiconductor device according to claim 1, wherein the first gate conductive layer comprises a P+polysilicon layer.

5. The method for manufacturing a semiconductor device according to claim 1, wherein etching the first gate conductive layer comprises:

forming a mask pattern for exposing a portion of the first gate conductive layer formed at a portion of the recess that is in contact with the source area over the first gate conductive layer;

etching the portion of the first gate conductive layer exposed by the mask pattern; and removing the mask pattern.

6. The method for manufacturing a semiconductor device according to claim 1, wherein the insulation layer is formed to have a thickness of approximately 100 to 200 Å from a surface of the semiconductor substrate.

7. The method for manufacturing a semiconductor device according to claim 1, wherein the insulation layer has a width of approximately ⅕ to ½ of a critical dimension of the gate.

8. The method for manufacturing a semiconductor device according to claim 1, wherein a lower surface of the insulation layer is positioned at the same level as a lower surface of the source area.

9. The method for manufacturing a semiconductor device according to claim 1, further comprising after forming the second gate conductive layer and before forming the third gate conductive layer:

planarizing a surface of the second gate conductive layer.

10. A method for manufacturing a gate of a semiconductor device, comprising:

forming a recess in a gate forming area of a semiconductor substrate having an active region including the gate forming area;

forming a gate insulation layer over the semiconductor substrate including the recess;

forming a first gate conductive layer over the gate insulation layer to fill in the recess;

etching the first gate conductive layer to remove a portion of the first gate conductive layer that corresponds to an upper end portion of a side of the recess;

forming an insulation layer at the upper end portion of the side wall of the recess from which the portion of the first gate conductive layer is removed;

forming a second gate conductive layer over the insulation layer and the first gate conductive layer;

forming sequentially a third gate conductive layer and a hard mask layer over the second gate conductive layer; and etching the hard mask layer, the third gate conductive layer, the second gate conductive layer, the first gate conductive layer, the insulation layer, and the gate insulation layer to form a gate.

11. The method for manufacturing a gate of a semiconductor device according to claim 10, wherein the recess is formed to a depth deeper than a lower surface of the source area and the drain area.

12. The method for manufacturing a gate of a semiconductor device according to claim 10, wherein the first gate conductive layer comprises a P+polysilicon layer.

13. The method for manufacturing a gate of a semiconductor device according to claim 10, wherein the insulation layer is formed to have a thickness of approximately 100 to 200 Å from a surface of the semiconductor substrate.

14. The method for manufacturing a gate of a semiconductor device according to claim 10, wherein the insulation layer has a width of approximately ⅕ to ½ of a critical dimension of the gate.

15. The method for manufacturing a gate of a semiconductor device according to claim 10, wherein a lower surface of the insulation layer is positioned at the same level as a lower surface of the source area.

16. A method for manufacturing a semiconductor device, the method comprising:

forming a semiconductor substrate with an active region comprising a gate forming area, a source forming area and a drain forming area;

forming a recess in the gate forming area;

forming a gate over the gate forming area formed with the recess, wherein the gate comprises an insulation layer formed at an upper end portion of a side wall of the recess, the upper end portion of a side wall of the recess being in contact with the source forming area; and forming a source area and a drain area in the active region on opposite sides of the gate, wherein a lower surface of the insulation layer is positioned at the same level as a lower surface of the source area.

17. The method for manufacturing a gate of a semiconductor device according to claim 16, wherein the recess is formed to a depth deeper than a lower surface of the source area and the drain area.

18. The method for manufacturing a semiconductor device of claim 16, wherein forming the source area and drain area comprises a source/drain ion implantation on the semiconductor substrate.

19. The method for manufacturing a gate of a semiconductor device according to claim 16, wherein the insulation layer is formed to have a thickness of approximately 100 to 200 Å from a surface of the semiconductor substrate.

20. The method for manufacturing a gate of a semiconductor device according to claim 16, wherein the insulation layer has a width of approximately ⅕ to ½ of a critical dimension of the gate.

* * * * *